United States Patent

Ogi et al.

[11] Patent Number: 5,807,495
[45] Date of Patent: Sep. 15, 1998

[54] BI-BASED DIELECTRIC THIN FILMS, AND COMPOSITIONS AND METHOD FOR FORMING THEM

[75] Inventors: Katsumi Ogi; Tadashi Yonezawa; Tsutomu Atsuki, all of Omiya, Japan

[73] Assignee: Mitsubishi Materials Corporation, Tokyo, Japan

[21] Appl. No.: 651,593

[22] Filed: May 22, 1996

[30] Foreign Application Priority Data

May 22, 1995 [JP] Japan ................................. 7-122423
Jul. 10, 1995 [JP] Japan ................................. 7-173438
Jul. 18, 1995 [JP] Japan ................................. 7-181780

[51] Int. Cl.$^6$ .................................................. C04B 35/00
[52] U.S. Cl. ..................... 252/62.9; 252/572; 438/482; 438/485; 438/486; 438/492; 438/496; 438/502; 204/192.15; 204/192.22; 257/43; 257/295; 427/126.3; 427/226; 427/62
[58] Field of Search ................................. 252/62.9, 572; 438/482, 485, 486, 492, 496, 502; 204/192.15, 192.22; 257/43, 295; 427/126.3, 226, 62

[56] References Cited

U.S. PATENT DOCUMENTS

| | | | |
|---|---|---|---|
| 5,426,075 | 6/1995 | Perino ..................................... | 437/235 |
| 5,508,226 | 4/1996 | Ito ........................................... | 437/130 |
| 5,519,234 | 5/1996 | Paz De Araujo ....................... | 257/295 |
| 5,525,434 | 6/1996 | Nashimoto ............................. | 428/692 |
| 5,601,869 | 2/1997 | Scott ...................................... | 427/126.3 |

OTHER PUBLICATIONS

CA:123:356330, Abstr of "Preparation of Bi–based ferroelectric thin films by sol–gel", Jpn J Appl. Physics 34(9B) 5096–9, Jan. 1995.

CA:123273109, Abstr of "c–Axis oriented ferroelectric SrBi2(TaxNb2–x)O9 thin films", Mater. Sci. Eng. B. 83–8, 1995.
Atsugi et al. JAPIO Publ. No. 08–319160, 1996.
Atsugi et al. JAPIO Publ. No. 09–025124, 1997.
Yamanaka et al. "Composite perovskite type lead system compounds for dielectric ceramics" CA 111:88998, 1989.
Fox et al. "Physics and Chemistry of the organic solid state" Inter Sci. p. 181, 1963.
Atsuki et al. "Preparation of Bi based ferroelectric thin films by sol–gel method" J.J. Appl. Phys. v. 34, pp. 5096–5099, 1995.

*Primary Examiner*—Ceila Chang
*Attorney, Agent, or Firm*—Oblon, Spivak, McClelland, Maier & Neustadt, P.C.

[57] ABSTRACT

Dielectrics represented by $(Sr_xBi_{1-x})Bi_2Ta_2O_y$, wherein $0<x<1$, and y represents the total number of oxygen atoms bonded to the respective metals, and thin films thereof, can be prepared by repeating the steps of applying compositions for forming the Sr—Bi—Ta—O-based dielectric thin films on substrates, drying and conducting a first-firing a plurality of times until the desired film thickness is achieved, and then conducting a second-firing for crystallization and compositions for forming Bi-based ferroelectric thin films and target materials for forming Bi-based ferroelectric thin films, both represented by the metal composition $((Sr_a(Ba_b, Pb_c))_xBi_y(Ta$ and/or $Nb)_z$ wherein $0.4 \leq X < 1.0$, $1.5 \leq Y \leq 3.5$, $Z=2$, $0.7X \leq a < X$, and $0 < b+c \leq 0.3X$ can be formed by repeatedly applied onto substrates, dried and subjected to a first-firing a plurality of times until the desired film thickness is achieved, and then subjected to a second-firing for crystallization, while the target materials are used to form films by sputtering, and the films undergo heat treatment during and/or after their formation for crystallization.

12 Claims, No Drawings

BI-BASED DIELECTRIC THIN FILMS, AND COMPOSITIONS AND METHOD FOR FORMING THEM

BACKGROUND OF THE INVENTION

1. Field of the Invention

The present invention relates to Bi-based ferroelectric thin films used for fabrication of semiconductor memories, optical switches, etc., and more particularly, to Sr—Bi—Ta—O-based dielectrics, thin films thereof, compositions for forming the thin films, and a method for forming the thin films; compositions for forming Bi-based ferroelectric thin films, the Bi-based ferroelectric thin films, and a method for forming the thin films; and target materials for forming the Bi-based ferroelectric thin films, and a method for forming the Bi-based ferroelectric thin films with the target materials.

2. Discussion of the Background

Known dielectric compositions which contain Sr, Ba, Pb, Bi, Ta or Nb include $SrBi_2Ta_2O_9$, $BaBi_2Ta_2O_9$, $PbBi_2Nb_2O_9$, etc. Thin films formed of $SrBi_2Ta_2O_9$ materials are promising for incorporation into semiconductor memories to fabricate nonvolatile memories, capitalizing on their hysteresis characteristics. These films undergo less film fatigue, that is, less reduction in the polarization after repeated polarization and reverse of the polarity, than PZT, lead zirconium titanate.

The polarization value, P, of $SrBi_2Ta_2O_9$ is 5.8 $\mu C/cm^2$ (the bulk polarization value). Future, high-density ferroelectric materials are anticipated to require residual polarization values of $2P_r=15$ $\mu C/cm^2$ or more, for 256 Mb memory devices. The residual polarization value of $SrBi_2Ta_2O_9$ is expected to be improved, in order to obtain thin films with much less film fatigue.

Methods for forming thin films of $SrBi_2Ta_2O_9$ have been described. PCT Publication Official Gazette WO94/10702 describes preparing a solution of precursors having a composition ratio, Sr:Bi:Ta=1:2.4:2, and then repeating steps of film formation, drying, and firing for crystallization (a sol-gel method). Here, a 20% excess of Bi compensates for the loss of Bi due to diffusion or evaporation during the crystallization heat treatment. The substrate used (e.g., Pt/Ti/SiO₂/Si substrate) is fired once, prior to the film formation, at a temperature equal to or over the maximum temperature which will be applied during the film-forming process. The firing temperature used to obtain the desired properties is approximately 700° C.

Although bulk $SrBi_2Ta_2O_9$ has been reported, there have been no reports of $(Sr_xBi_{1-x})Bi_2Ta_2O_y$, (0<x<1). Likewise, compositions reported for forming (Sr, Ba, Pb)-Bi-(Ta, Nb)-based dielectrics describe a ratio of (Sr, Ba, Pb):Bi:(Ta, Nb)=1:1.8-4:2, where (Sr, Ba, Pb)=1, and thus do not report compositions where (Sr, Ba, Pb)<1.

The conventional sol-gel method for forming films heat treats substrates prior to film formation, and fires dried films at a high temperature, on the order of 700°–800° C., in order to acquire satisfactory electric properties. This causes very serious thermal damage to the substrates. For example, when Pt/Ti/SiO₂ or Pt/Ta/SiO₂ substrates are fired at 800° C., the surface metallic luster is lost, Ta and/or Ti precipitates, and the surfaces become coarse due to oxidation.

As mentioned above, the polarization value $P_r$ of $SrBi_2Ta_2O_9$ is 5.8 $\mu C/cm^2$ as the bulk polarization value. Since the residual polarization values required for future, high-density ferroelectric materials is expected to be $2P_r=15$ $\mu C/cm^2$ or more for 256 Mb memory devices, the residual polarization value of $SrBi_2Ta_2O_9$ is expected to be improved, making it possible to obtain thin films with much less film fatigue. In this connection, although the bulk polarization value of $PbBi_2Nb2O_9$ is greater than that of $SrBi_2Ta_2O_9$, satisfactory fatigue properties are not obtained due to the inclusion of Pb.

SUMMARY OF THE INVENTION

An object of the present invention is to overcome the problems of the prior art, thereby providing Sr—Bi—Ta—O-based dielectrics with increased residual polarization, which is free from film fatigue, and thin films of the dielectrics.

Another object of the present invention is to provide compositions for forming thin films, which allow formation of ferroelectric thin films with satisfactory electric properties without requiring high-temperature processing prior to film formation, as well as a method for forming the thin films.

Still another object of the present invention is to provide compositions for forming Bi-based ferroelectric thin films having excellent electric properties with increased residual polarization values, which are free from film fatigue, allow formation of thin films without requiring high-temperature processing prior to film formation, Bi-based ferroelectric thin films, and a method for forming the thin films.

Yet another object of the present invention is to provide target materials for forming Bi-based ferroelectric thin films which have increased residual polarization values and excellent electric properties, and which are free from film fatigue, allowing formation of the Bi-based ferroelectric thin films by sputtering, and a method for forming the Bi-based ferroelectric thin films with the target materials.

The Sr—Bi—Ta—O-based dielectrics of the present invention contain Sr—Bi—Ta composite oxides which are represented by the composition: $(Sr_xBi_{1-x})Bi_2Ta_2O_y$, wherein 0<x<1, and y represents the total number of oxygen atoms bonded to the respective metals. The formula $(Sr_xBi_{1-x})Bi_2Ta_2$ describes the ratio of the metals Sr, Bi and Ta.

The Sr—Bi—Ta—O-based dielectric thin films of the present invention are thin films of the dielectrics mentioned above.

The compositions for forming the Sr—Bi—Ta—O-based dielectric thin films of the present invention are prepared by mixing metal compounds in an organic solvent, in such proportions so as to provide a metal composition ratio (molar ratio) in solution which is represented by Sr:Bi:Ta= $\alpha:\beta:\gamma$, wherein $0.05 \leq \alpha/\gamma < 0.5$, and $0.7 \leq \beta/\gamma \leq 2$.

The method for forming the Sr—Bi—Ta—O-based dielectric thin films of the present invention involves application of each of the compositions onto a substrate, drying, and a first-firing, which are repeated a plurality of times until the desired film thickness is achieved, and a subsequent second-firing for crystallization.

The Sr—Bi—Ta—O-based dielectrics of the present invention are related to conventional $SrBi_2Ta_2O_9$, where part of the composition is replaced by Bi, improving its ferroelectric properties; the dielectric compositions of the present invention provide ferroelectric Sr—Bi—Ta—O-based dielectrics with increased residual polarization and reduced film fatigue.

The compositions for forming the Sr—Bi—Ta—O-based dielectric thin films and the method for forming the thin films of the present invention allow for formation of high-performance dielectric thin films without requiring a heat treatment of the substrates prior to film formation, and at lower first-firing temperatures for forming the films. Thus, an adverse thermal effect on the substrates is prevented.

Compositions for forming the Bi-based ferroelectric thin films of the present invention are prepared by mixing metal compounds in an organic solvent, in proportions so as to provide a metal composition ratio (molar ratio) in solution which is represented by A:B:C=X:Y:Z, of $0.4 \leq X < 1.0$, $1.5 \leq Y \leq 3.5$, $Z=2$, wherein A represents Sr and one or two members selected from Ba and Pb, B represents Bi, and C represents Ta and/or Nb, particularly by Sr:Ba:Pb=a:b:c, wherein $0.7X \leq a < X$, $0 < b+c \leq 0.3X$.

The Bi-based ferroelectric thin films of the present invention can be obtained by application of each of the compositions for forming the Bi-based ferroelectric thin films onto a substrate, drying, and a first-firing, which are repeated a plurality of times until the desired film thickness is achieved, and a subsequent second-firing for crystallization. The Bi-based ferroelectric contains a complex oxide containing Sr, Bi, Ta, and at least one member selected from the group consisting of Pb, Ba and Nb.

A method for forming the Bi-based ferroelectric thin films of the present invention is repeating the steps of applying onto a substrate compositions for forming the Bi-based ferroelectric thin films, drying and subjecting to a first-firing, a plurality of times, until the desired film thickness is achieved, and then subjecting the film to a second-firing for crystallization.

Target materials for forming the Bi-based ferroelectric thin films of the present invention can be prepared by mixing powders of metal oxides and sintering the resulting mixture, in proportions so as to provide a metal composition ratio (molar ratio) which is represented by A:B:C=X:Y:Z, of $0.4 \leq X < 1.0$, $1.5 \leq Y \leq 3.5$, $Z=2$, wherein A represents Sr and one or two members selected from Ba and Pb, B represents Bi, and C represents Ta and/or Nb, particularly by Sr:Ba:Pb=a:b:c, wherein $0.7X \leq a < X$, $0 < b+c \leq 0.3X$.

Another method for forming the Bi-based ferroelectric thin films of the present invention is to form films by sputtering the target materials, and then subjecting the films to heat treatment during and/or after formation, for crystallization.

The metal composition of the Bi-based ferroelectrics of the present invention are related to conventional Sr—Bi—Ta-based dielectrics where part of the Sr in the composition is replaced by Ba and/or Pb, and in some cases, by replacing part or the entirety of the Ta by Nb to improve the ferroelectric properties. The compositions allow preparation of high-performance Bi-based ferroelectrics with increased residual polarization and reduced film fatigue. Even in cases where the films are formed by a the sol-gel method, high-performance Bi-based ferroelectrics can be formed without requiring heat treatment of the substrates prior to film formation, and at lower first-firing temperatures for forming the films, thus preventing an adverse thermal effect on the substrates. The method can be performed without heating at 700° C. or above.

Although the stoichiometric ratio is Sr:Bi:Ta=1:2:2 for Sr—Bi—Ta-based dielectrics, ferroelectric films with increased residual polarization and reduced film fatigue are provided by a proportion, X, of Sr of smaller than 1, but 0.4 or greater, in solutions or target materials. In addition, replacement of part of the Sr by Ba serves to reduce the coercive electric field. Nevertheless, the residual polarization is reduced as well, if the proportion of the total of the replacement Ba and Pb is over 0.3 times as much as X. Replacement of part of the Sr by Pb serves to increase the residual polarization, but causes increased coercive electric field as well. The replacement of Sr by Pb further presents the additional problem of film fatigue, in Pb-based ferroelectrics. For the foregoing reasons, the proportion of Pb and/or Ba must be 0.3 times or less, than X.

Lower contents of Bi fail to provide satisfactory properties, while at high content the films lose the insulating properties. Also, the replacement of Ta by Nb results in a slight improvement in the residual polarization.

DETAILED DESCRIPTION OF THE INVENTION

First, an explanation will be given regarding Sr—Bi—Ta—O-based dielectrics, thin films of the dielectrics, compositions for forming the thin films, and a method for forming the thin films, all according to the present invention.

Dielectrics represented by $(Sr_xBi_{1-x})Bi_2Ta_2O_y$, where X is 0 or 1, do not have the satisfactory dielectric properties of the present invention. Composition of the present invention, $(Sr_xBi_{1-x})Bi_2Ta_2O_y$, preferably have $0.5 \leq x < 1$, more preferably $0.5 \leq x < 0.9$, where y represents the total number of oxygen atoms bonded to the respective metal atoms. In these materials one would expect $y=9.5-0.5x$.

Sr—Bi—Ta—O-based dielectric thin films preferably have a thickness of 10 nm to 1 $\mu$m, more preferably 80 to 800 nm. Film thicknesses of less than 10 nm are too small to provide insulating properties. When the film thicknesses increase beyond 1 $\mu$m, grains grow abundantly, making the surface coarse.

Compositions for forming the Sr—Bi—Ta—O-based dielectric thin films of the present invention are prepared by mixing organic or inorganic metal compounds in an organic solvent so that the metal composition ratio (molar ratio) in each solution is represented by Sr:Bi:Ta=$\alpha$:$\beta$:$\gamma$, wherein $0.05 \leq \alpha/\gamma < 0.5$, and $0.7 \leq \beta/\gamma \leq 2$, preferably $0.3 \leq \alpha/\gamma \leq 0.4$, and $0.8 \leq \beta/\gamma \leq 1.5$. The metal composition ratios which satisfy these conditions allow for formation of high-performance dielectric thin films with excellent electric properties. High-temperature processing is not required, thus preventing any adverse thermal effect on the substrates.

Organic solvents for preparing the compositions include acetic esters such as ethyl acetate, propyl acetate, butyl acetate and isoamyl acetate; alcohols such as ethanol, propanol, butanol and 2-methoxyethanol; etc.; and mixtures thereof. Suitable Sr compounds include strontium carboxylates such as strontium octylate, strontium n-hexanoate, strontium 2-ethylbutyrate and strontium isovalerate; strontium alkoxides such as strontium ethoxide, strontium propoxide and strontium 2-methoxyethoxide; etc.; and mixtures thereof. Bi compounds include organic Bi compounds such as bismuth carboxylates, for example, bismuth octylate, bismuth n-hexanoate, bismuth 2-ethylbutylate and bismuth isovalerate; and inorganic Bi compounds such as bismuth nitrate; and mixtures thereof. Suitable Ta compounds include tantalum alkoxides such as tantalum ethoxide, tantalum propoxide, tantalum butoxide and tantalum 2-methoxyethoxide; tantalum carboxylates such as tantalum octylate, tantalum n-hexanoate, tantalum 2-ethylbutyrate and tantalum isovalerate; etc.; and mixtures thereof. These metal compounds are mixed in an organic solvent in proportions so that the total content, in terms of their oxides, is 5–15% by weight of the composition.

A method for forming the Sr—Bi—Ta—O-based dielectric thin films comprises applying the composition onto a substrate, drying, and performing a first firing. These steps can be repeated a plurality of times until the desired film thickness is achieved. A subsequent second firing can be performed for crystallization. Substrates available include Pt/Ti/SiO$_2$/Si substrates, Pt/Ta/SiO$_2$/Si substrates, Pt/SiO$_2$/Si substrates, Ir/IrO$_2$/Si substrates, Pt/TiN/SiO$_2$/Si substrates, Pt/Ir/SiO$_2$/Si substrates, Pt-Ir alloy/IrO$_2$/Si substrates, Pt/Ir/Iro$_2$/Si substrate, etc. These substrates can be used for formation of the films without a heat treatment.

The compositions can be applied by a spin coating process, a dip coating process, a spraying process or the like. Applying, drying and first firing can be repeated until a dielectric thin film with a predetermined film thickness is obtained. The first-firing is advantageously carried out at a temperature of 200°–600° C., particularly at a low temperature of 200°–400° C., for approximately 1–30 minutes.

After the composition has been applied, dried and subjected to a first-firing, to the desired film thickness on the substrate, it undergoes a second-firing for crystallization. The second-firing is carried out in an oxygen atmosphere at 600°–900° C., particularly 600°–800° C., for 20 minutes to 2 hours. This allows for the formation of the Sr—Bi—Ta—O-based dielectric thin films having a high dielectric performance with increased residual polarization values and reduced film fatigue, without requiring high-temperature processing.

An explanation will now be given regarding compositions for forming the Bi-based ferroelectric thin films, target materials used for forming the Bi-based ferroelectric thin films, the Bi-based ferroelectric thin films, and a method for preparing the thin films, all according to the present invention.

Compositions, for forming the Bi-based ferroelectric thin films and the target materials for forming the Bi-based ferroelectric thin films, contain solutions having a ratio of metals represented by A:B:C=X:Y:Z, wherein A represents Sr, Ba and/or Pb; B represents Bi; and C represents Ta and/or Nb. These compositions provide ferroelectric films with increased residual polarization and reduced film fatigue when a metal composition ratio (molar ratio) X in the solutions is 0.4 or more, but less than 1. The residual polarization is drastically reduced in cases where X is less than 0.4. The range $1.5 \leq Y \leq 3.5$ is required, since satisfactory properties are not achieved when Y is less than 1.5, whereas the films lose the insulating properties with Y beyond 3.5. Z is 2 based on the stoichiometric ratio of the Sr—Bi—Ta-based compositions.

Replacement of part of the Sr by Ba serves to reduce the coercive electric field, but can cause reduction of the residual polarization when the proportion of replacement is in excess. In addition, replacement of part of the Sr by Pb results in increased residual polarization, accompanied by an increase in the coercive electric field, if the proportion of replacement is in excess. For the foregoing reasons, the proportion of replacement by Ba and/or Pb is controlled so that $0.7X \leq a < X$, and $0 < b+c \leq 0.3X$ in the ratio Sr:Ba:Pb=a:b:c. Replacement of part or the entirety of the Ta by Nb can also serve to increase the residual polarization. Preferably, the proportion of replacement is within the range $0 \leq m \leq 0.7$ in the ratio Ta:Nb=m:(1−m).

Compositions for forming the thin films are easily prepared by mixing organic compounds and/or inorganic compounds of the metals, into an organic solvent, in such proportions as to provide the above-defined metal composition ratios. The organic solvents, Sr compounds, Bi compounds and Ta compounds can be the same as those used in the compositions for forming the Sr—Bi—Ta—O-based dielectric thin films. The Ba compounds include carboxylates such as barium octylate, barium n-hexanoate, barium 2-ethylbutyrate and barium isovalerate; alkoxides such as barium ethoxide, barium propoxide and barium 2-methoxyethoxide; etc.; and mixtures thereof. The Pb compounds include carboxylates such as lead octylate, lead n-hexanoate, lead 2-ethylbutyrate, lead isovalerate and lead acetate; alkoxides such as lead ethoxide, lead propoxide and lead butoxide; etc.; and mixtures thereof. The Nb compounds include alkoxides such as niobium ethoxide, niobium propoxide, niobium butoxide, niobium 2-methoxyethoxide; carboxylates such as niobium octylate, niobium n-hexanoate, niobium 2-ethylbutyrate and niobium isovalerate; etc.; and mixtures thereof. The metal compounds are mixed in an organic solvent in proportions so that the total content, in terms of the oxides, is 5–15% by weight of the composition.

The compositions may contain additives for improving properties, such as compounds of rare-earth elements with close ionic radii, including La, Ce, Pr, Nd, Eu, Tb, Dy, Er, Yb, in addition to the metal compounds mentioned above. Here, the amounts of these additives to be added preferably are zero to 0.15 times the molar amount of Ta or Nb. The rare-earth elements can be added as organic or inorganic compounds, such as the rare-earth element equivalents of the compounds described for the addition of Sr, Bi, Ta, Ba, Nb and Pb.

The Bi-based ferroelectric thin films are prepared by repeatedly applying the compositions onto a substrate, drying and subjecting them to a first-firing, until the desired film thickness is achieved, and then subjecting them to a second-firing for crystallization. The substrate can be the same as those used in the method for forming the Sr—Bi—Ta—O-based dielectric thin films, and the substrates can be used for forming the thin films without requiring any heat treatment.

The method and conditions are the same as those described for the formation of the Sr—Bi—Ta—O-based dielectric thin films. The Bi-based ferroelectric thin films with increased polarization values, reduced film fatigue and high dielectric performance can be easily formed without high-temperature processing.

The target materials for forming the Bi-based ferroelectric thin films can be easily prepared by mixing powders of metal oxides in such proportions as to provide the metal composition ratios described above, and sintering the resulting mixtures by hot pressing, HIP (hot isostatic pressing), or the like. Sintering conditions for hot pressing, for example, preferably include a temperature of 800°–1,200° C., and a pressure of 30–400 kg/cm$^2$ in atmosphere under reduced pressure of $1 \times 10^{-1}$ to $1 \times 10^{-5}$ Torr, or in a vacuum for 30 minutes to 4 hours.

The target materials may contain additives for improving properties, such as compounds of rare-earth elements with close ionic radii, for example, La, Ce, Pr, Nd, Eu, Tb, Dy, Er and Yb, in addition to the metal elements mentioned above. Here, the amounts of these elements to be added preferably are zero to 0.15 times the molar amount of Ta or Nb. These elements can be added as oxides.

The Bi-based ferroelectric thin films can be prepared conventionally on the surface of substrates by sputtering the target materials. The films can undergo heat treatment during and/or after their formation for crystallization. The substrates can be the same as those used for forming the Sr—Bi—Ta—O-based dielectric thin films.

The sputtering conditions preferably include the following:

Film forming temperature: Room temperature to 800° C.

RF power: 20–500 W
Gas pressure: $1\times10^{-2}$–$1\times10^{-5}$ Torr

The heat treatment during and/or after formation of the films is preferably carried out at 600°–900° C. for 30 minutes to 3 hours.

The thickness of the Bi-based ferroelectric thin films, prepared using compositions or the target materials, is 10 nm to 1 µm, preferably 80–800 nm. A film thickness of less than 10 nm is too small to provide insulating properties. When the film thickness is increased beyond 1 µm, grains grow abundantly, making the surfaces coarse.

The use of dielectric materials of the present invention results in excellent devices, free from film fatigue.

mens. The residual polarization and the film fatigue properties (as rates (%) of the respective residual polarization observed after $10^{10}$ turns relative to the original values) of the respective specimens were examined with the results shown in Table 1.

It is apparent from Table I that the Sr—Bi—Ta—O-based dielectric thin films of the present invention have increased residual polarization and reduced film fatigue.

TABLE 1

| Thin films | | Comp. for formation of thin films (molar ratio) Sr:Bi:Ta = α:β:γ | | | | | Rep. times of application, drying and first-firing | First-firing cond. Temp. (°C.) | Time (min.) | Second-firing cond. Temp. (°C.) | Time (min.) | Dielectric thin films $(Sr_xBi_{1-x})Bi_2Ta_2O_y$ Film thickness (Å) | X | Y | Residual polarization $(2P_r)$ (µC/cm²) | Film fatigue properties (%) |
|---|---|---|---|---|---|---|---|---|---|---|---|---|---|---|---|---|
| | | α | β | γ | α/γ | β/γ | | | | | | | | | | |
| Examples | 1 | 0.3 | 2.9 | 2 | 0.15 | 1.45 | 3 | 400 | 10 | 800 | 60 | 2400 | 0.3 | 9.35 | 4 | 97 |
| | 2 | 0.4 | 2.8 | 2 | 0.2 | 1.4 | 3 | 400 | 10 | 800 | 60 | 2400 | 0.4 | 9.30 | 6 | 97 |
| | 3 | 0.5 | 2.6 | 2 | 0.25 | 1.3 | 3 | 400 | 10 | 800 | 60 | 2400 | 0.5 | 9.25 | 9 | 96 |
| | 4 | 0.7 | 2.4 | 2 | 0.35 | 1.2 | 3 | 400 | 10 | 800 | 60 | 2400 | 0.7 | 9.15 | 12 | 98 |
| | 5 | 0.9 | 2.4 | 2 | 0.45 | 1.2 | 3 | 400 | 10 | 800 | 60 | 2400 | 0.9 | 9.05 | 5 | 97 |
| Compar. Examples | 1 | 0 | 3 | 2 | 0 | 1.5 | 3 | 400 | 10 | 800 | 60 | 2400 | 0 | 9.50 | 0 | — |
| | 2 | 1.0 | 2.4 | 2 | 0.5 | 1.2 | 3 | 400 | 10 | 800 | 60 | 2400 | 1 | 9.00 | 2 | 99 |

Having generally described this invention, a further understanding can be obtained by reference to certain specific examples which are provided herein for purposes of illustration only and are not intended to be limiting unless otherwise specified.

In the following Examples and Comparative examples, isoamyl acetate was used as the organic solvent for the thin-film forming compositions, and the metal compounds used were those listed below. The respective compounds were mixed at given composition ratios such that their total content, in terms of the oxides, comprise 10% by weight of each composition.

Sr compound: Strontium octylate

Ba compound: Barium octylate

Pb compound: Lead octylate

Bi compound: Bismuth octylate

Ta compound: Tantalum ethoxide

Nb compound: Niobium ethoxide

EXAMPLES 1–5, AND COMPARATIVE EXAMPLES 1 AND 2

The Ta compound, Bi compound and Sr compound were mixed in proportions to provide the metal composition ratios listed in Table 1, to prepare compositions for forming thin films. Each of the compositions was repeatedly applied to a Pt/Ta/SiO$_2$/Si substrate by spin coating, dried and subjected to a first-firing for the number of times listed in Table 1. The conditions for the first-firing are also listed in Table 1. The films were then subjected to a second-firing in an oxygen atmosphere under conditions listed in Table 1, to provide dielectric thin films with film thicknesses and compositions listed in Table 1.

Gold was evaporated onto the respective thin films by vacuum evaporation coating, forming upper electrodes, and then annealed at 800° C. for 10 minutes to prepare specimens. The residual polarization and the film fatigue properties (as rates (%) of the respective residual polarization observed after $10^{10}$ turns relative to the original values) of the respective specimens were examined with the results shown in Table 1.

These examples show Sr—Bi—Ta—O-based dielectrics and Sr—Bi—Ta—O-based dielectric thin films with ferroelectric properties, increased residual polarization and reduced film fatigue. In addition, these high-performance Sr—Bi—Ta—O-based dielectrics and Sr—Bi—Ta—O-dielectric thin films can be formed without high-temperature processing, and thus prevent any adverse thermal effect on the substrates.

EXAMPLES 6–21 AND COMPARATIVE EXAMPLES 3–22

The respective metal compounds were mixed in proportions to provide the metal composition ratios listed in Tables 2–4, to prepare compositions for forming thin films. Each of the compositions was repeatedly applied to a Pt/Ta/SiO$_2$/Si substrate by spin coating, dried and subjected to a first-firing for the number of times listed in Tables 2–4. The conditions for the first-firing are also listed in Tables 2–4. The films were then subjected to a second-firing in an oxygen atmosphere under conditions listed in Tables 2–4, to provide Bi-based ferroelectric thin films with film thicknesses listed in Tables 2–4.

Gold was evaporated onto the respective thin films by vacuum evaporation, forming upper electrodes, and then annealed at 800° C. for 10 minutes to prepare specimens. The residual polarization, the coercive electric field and the film fatigue properties (as rates (%) of the respective residual polarization observed after $10^{10}$ turns relative to the original values) of the respective specimens were examined with the results shown in Tables 2–4.

It is apparent from Tables 2–4 that the Bi-based ferroelectric thin films of the present invention have increased residual polarization, satisfactory values of coercive electric field, and reduced film fatigue.

TABLE 2

(Sr, Ba)-Bi-(Ta, Nb)-base

| Thin films | | Composition ratios of solutions (Sr:Ba):Bi:(Ta:Nb) = (a:b)X:Y:(m:n)Z = aX:bX:Y:mZ:nZ | | | | | | | Rep. times of application, drying and first-firing | First-firing cond. | | Second-firing cond. | | Film thickness (Å) | Residual polarization ($\mu C/cm^2$) 2$P_r$ | Coercive electric field (kV/cm) 2$E_c$ | Film fatigue properties (%) |
|---|---|---|---|---|---|---|---|---|---|---|---|---|---|---|---|---|---|
| | | a (Sr) | b (Ba) | X | Y | m (Ta) | n (Nb) | Z | | Temp. (°C.) | Time (min.) | Temp. (°C.) | Time (min.) | | | | |
| Examples | 6 | 0.9 | 0.1 | 0.8 | 2.1 | 1 | 0 | 2 | 3 | 400 | 10 | 800 | 60 | 2020 | 14 | 69 | 98 |
| | 7 | 0.8 | 0.2 | 0.8 | 2.3 | 0.5 | 0.5 | 2 | 3 | 400 | 10 | 800 | 60 | 2100 | 13 | 65 | 96 |
| | 8 | 0.7 | 0.3 | 0.8 | 1.9 | 0 | 1 | 2 | 3 | 400 | 10 | 800 | 60 | 2130 | 13 | 66 | 97 |
| | 9 | 0.7 | 0.3 | 0.6 | 2.6 | 1 | 0 | 2 | 3 | 400 | 10 | 800 | 60 | 1980 | 11 | 60 | 94 |
| | 10 | 0.8 | 0.2 | 0.6 | 3.2 | 0.5 | 0.5 | 2 | 3 | 400 | 10 | 800 | 60 | 2300 | 13 | 70 | 95 |
| | 11 | 0.9 | 0.1 | 0.6 | 1.9 | 0 | 1 | 2 | 3 | 400 | 10 | 800 | 60 | 2210 | 10 | 62 | 92 |
| Compar. Examples | 3 | 0.6 | 0.4 | 0.9 | 2.1 | 1 | 0 | 2 | 3 | 400 | 10 | 800 | 60 | 2030 | 9 | 60 | 98 |
| | 4 | 0.5 | 0.5 | 0.9 | 2.4 | 0.5 | 0.5 | 2 | 3 | 400 | 10 | 800 | 60 | 2090 | 5 | 20 | 92 |
| | 5 | 0.1 | 0.9 | 0.9 | 3.1 | 0 | 1 | 2 | 3 | 400 | 10 | 800 | 60 | 2160 | 1 | 2 | 94 |
| | 6 | 0.9 | 0.1 | 0.2 | 2.8 | 1 | 0 | 2 | 3 | 400 | 10 | 800 | 60 | 2310 | 2 | 1 | 91 |
| | 7 | 0.8 | 0.2 | 0.2 | 2.6 | 0.5 | 0.5 | 2 | 3 | 400 | 10 | 800 | 60 | 2090 | 2 | 3 | 93 |
| | 8 | 0.7 | 0.3 | 0.2 | 2.2 | 0 | 1 | 2 | 3 | 400 | 10 | 800 | 60 | 2150 | 1 | 4 | 95 |
| | 9 | 0.8 | 0.2 | 0.9 | 1.0 | 0.5 | 0.5 | 2 | 3 | 400 | 10 | 800 | 60 | 2160 | 4 | 5 | 98 |
| | 10 | 0.8 | 0.2 | 0.9 | 4.2 | 0.5 | 0.5 | 2 | 3 | 400 | 100 | 800 | 60 | 2000 | Unmeasurable due to loss of insulating properties of thin film | | |

TABLE 3

(Sr, Ba)-Bi-(Ta, Nb)-base

| Thin films | | Composition ratios of solutions (Sr:Ba):Bi:(Ta:Nb) = (a:b)X:Y:(m:n)Z = aX:bX:Y:mZ:nZ | | | | | | | Rep. times of application, drying and first-firing | First-firing cond. | | Second-firing cond. | | Film thickness (Å) | Residual polarization ($\mu C/cm^2$) 2$P_r$ | Coercive electric field (kV/cm) 2$E_c$ | Film fatigue properties (%) |
|---|---|---|---|---|---|---|---|---|---|---|---|---|---|---|---|---|---|
| | | a (Sr) | c (Pb) | X | Y | m (Ta) | n (Nb) | Z | | Temp. (°C.) | Time (min.) | Temp. (°C.) | Time (min.) | | | | |
| Examples | 12 | 0.9 | 0.1 | 0.9 | 2.2 | 1 | 0 | 2 | 3 | 400 | 10 | 800 | 60 | 1990 | 18 | 72 | 98 |
| | 13 | 0.8 | 0.2 | 0.9 | 2.3 | 0.5 | 0.5 | 2 | 3 | 400 | 10 | 800 | 60 | 2210 | 20 | 80 | 94 |
| | 14 | 0.7 | 0.3 | 0.9 | 2.5 | 0 | 1 | 2 | 3 | 400 | 10 | 800 | 60 | 2050 | 24 | 90 | 90 |
| | 15 | 0.7 | 0.3 | 0.5 | 3.0 | 1 | 0 | 2 | 3 | 400 | 10 | 800 | 60 | 2300 | 14 | 70 | 92 |
| | 16 | 0.8 | 0.2 | 0.5 | 2.8 | 0.5 | 0.5 | 2 | 3 | 400 | 10 | 800 | 60 | 2250 | 14 | 73 | 92 |
| | 17 | 0.9 | 0.1 | 0.5 | 2.6 | 0 | 1 | 2 | 3 | 400 | 10 | 800 | 60 | 2130 | 12 | 70 | 96 |
| Compar. Examples | 11 | 0.6 | 0.4 | 0.8 | 2.5 | 1 | 0 | 2 | 3 | 400 | 10 | 800 | 60 | 2190 | 26 | 80 | 79 |
| | 12 | 0.4 | 0.6 | 0.8 | 3.1 | 0.5 | 0.5 | 2 | 3 | 400 | 10 | 800 | 60 | 2090 | 28 | 82 | 60 |
| | 13 | 0.1 | 0.9 | 0.8 | 2.7 | 0 | 1 | 2 | 3 | 400 | 10 | 800 | 60 | 2200 | 29 | 100 | 92 |
| | 14 | 0.9 | 0.1 | 0.2 | 3.0 | 1 | 0 | 2 | 3 | 400 | 10 | 800 | 60 | 2010 | 4 | 11 | 96 |
| | 15 | 0.8 | 0.2 | 0.2 | 3.1 | 0.5 | 0.5 | 2 | 3 | 400 | 10 | 800 | 60 | 2230 | 3 | 12 | 94 |
| | 16 | 0.7 | 0.3 | 0.2 | 3.2 | 0 | 1 | 2 | 3 | 400 | 10 | 800 | 60 | 2290 | 2 | 10 | 88 |
| | 17 | 0.9 | 0.1 | 0.9 | 1.0 | 0.5 | 0.5 | 2 | 3 | 400 | 10 | 800 | 60 | 2110 | 4 | 9 | 92 |
| | 18 | 0.9 | 0.1 | 0.9 | 4.0 | 0.5 | 0.5 | 2 | 3 | 400 | 10 | 900 | 60 | 2110 | Unmeasurable due to loss of insulating properties of thin film | | |

TABLE 4

(Sr, Ba, Pb)-Bi-(Ta, Nb)-base

| Thin films | | Composition ratios of solutions (Sr:Ba:Pb):Bi:(Ta:Nb) = (a:b:c)X:Y:(m:n)Z = aX:bX:cX:Y:mZ:nZ | | | | | | | | Rep. times of application, drying and first-firing | First-firing cond. | | Second-firing cond. | | Film thickness (Å) | Residual polarization ($\mu C/cm^2$) 2$P_r$ | Coercive electric field (kV/cm) 2$E_c$ | Film fatigue properties (%) |
|---|---|---|---|---|---|---|---|---|---|---|---|---|---|---|---|---|---|---|
| | | a (Sr) | b (Ba) | c (Pb) | X | Y | m (Ta) | n (Nb) | Z | | Temp. (°C.) | Time (min.) | Temp. (°C.) | Time (min.) | | | | |
| Examples | 18 | 0.8 | 0.1 | 0.1 | 0.9 | 2.6 | 1.0 | 0 | 2 | 3 | 400 | 10 | 800 | 60 | 2030 | 20 | 72 | 96 |
| | 19 | 0.7 | 0.2 | 0.1 | 0.9 | 2.2 | 0.5 | 0.5 | 2 | 3 | 400 | 10 | 800 | 60 | 2050 | 18 | 80 | 94 |
| | 20 | 0.9 | 0.05 | 0.05 | 0.5 | 1.9 | 0 | 1.0 | 2 | 3 | 400 | 10 | 800 | 60 | 2100 | 12 | 75 | 98 |
| | 21 | 0.7 | 0.1 | 0.2 | 0.5 | 2.8 | 0.5 | 0.5 | 2 | 3 | 400 | 10 | 800 | 60 | 2110 | 10 | 70 | 91 |
| Compar. Examples | 19 | 0.5 | 0.2 | 0.3 | 0.9 | 2.4 | 1.0 | 0 | 2 | 3 | 400 | 10 | 800 | 60 | 2060 | 22 | 76 | 88 |
| | 20 | 0.8 | 0.1 | 0.1 | 0.3 | 2.2 | 0.5 | 0.5 | 2 | 3 | 400 | 10 | 800 | 60 | 2140 | 4 | 60 | 92 |
| | 21 | 0.8 | 0.1 | 0.1 | 0.8 | 0.9 | 0 | 1.0 | 2 | 3 | 400 | 10 | 800 | 60 | 2200 | 2 | 15 | 94 |
| | 22 | 0.7 | 0.2 | 0.1 | 0.9 | 4.2 | 0.5 | 0.5 | 2 | 3 | 400 | 10 | 800 | 60 | 2120 | Unmeasurable due to loss of insulating properties of thin film | | |

The examples demonstrate that high-performance Bi-based ferroelectric thin films with increased residual polarization and reduced film fatigue can be formed without requiring high-temperature processing, thus preventing any adverse thermal effect on the substrates.

EXAMPLES 22–37 AND COMPARATIVE EXAMPLES 23–42

Powders of metal oxides $Ta_2O_5$, $Nb_2O_5$, $Bi_2O_3$, SrO, BaO and PbO were mixed in proportions to provide the metal composition ratios listed in Tables 5–7, and the resulting mixtures were sintered by hot pressing under the following conditions to prepare target materials for forming thin films.

Conditions for the hot pressing

Temperature: 1,100° C.

Applied pressure: 150 kg/cm$^2$

Atmosphere: 10$^{-4}$ Torr

Time: 2 hours

Films were formed on Pt/Ti/SiO$_2$/Si substrates using the resulting target materials, by sputtering under the following conditions:

Conditions for the sputtering

Film forming temperature: 350° C.

RF power: 300 W

Gas pressure: 5–7×10$^{-2}$ Torr

O$_2$/Ar ratio: 1 (volumetric ratio)

Film formation rate: 120–150 Å/min.

The films were then subjected to a heat treatment for crystallization, at temperatures and times listed in Tables 5–7. The Bi-based ferroelectric thin films formed had film thicknesses listed in Tables 5–7.

Pt films were formed on these thin films by sputtering to form upper electrodes, and then annealed at 800° C. for 10 minutes to prepare specimens. The residual polarization, the coercive electric field and the film fatigue properties (as rates (%) of the respective residual polarization observed after 10$^{10}$ turns relative to the original values) of the respective specimens were examined with the results shown in Tables 5–7.

It is apparent from Tables 5–7 that the Bi-based ferroelectric thin films prepared with the target materials have increased residual polarization, satisfactory values of coercive electric field, and reduced film fatigue.

TABLE 5

(Sr, Ba)-Bi-(Ta, Nb)-base

| | | Composition ratios of target materials (Sr:Ba):Bi:(Ta:Nb) = (a:b)X:Y:(m:n)Z = aX:bX:Y:mZ:nZ | | | | | | Film formation temp. | Heat treatment cond. | | Film | Residual polarization | Coercive | Film fatigue |
|---|---|---|---|---|---|---|---|---|---|---|---|---|---|---|
| Thin films | | a (Sr) | b (Ba) | X | Y | m (Ta) | n (Nb) | Z | Temp. (°C.) | Temp. (°C.) | Time (min.) | thickness (Å) | ($\mu C/cm^2$) 2P$_r$ | electric field (kV/cm) 2E$_c$ | properties (%) |
| Examples | 22 | 0.9 | 0.1 | 0.9 | 2.8 | 1 | 0 | 2 | 350 | 800 | 60 | 2000 | 14 | 79 | 98 |
| | 23 | 0.8 | 0.2 | 0.9 | 2.1 | 0.5 | 0.5 | 2 | 350 | 800 | 60 | 2050 | 14 | 75 | 97 |
| | 24 | 0.7 | 0.3 | 0.9 | 1.9 | 0 | 1 | 2 | 350 | 800 | 60 | 2100 | 12 | 70 | 98 |
| | 25 | 0.7 | 0.3 | 0.5 | 3.0 | 1 | 0 | 2 | 350 | 800 | 60 | 2100 | 10 | 58 | 96 |
| | 26 | 0.8 | 0.2 | 0.5 | 2.4 | 0.5 | 0.5 | 2 | 350 | 800 | 60 | 1950 | 10 | 52 | 98 |
| | 27 | 0.9 | 0.1 | 0.5 | 2.0 | 0 | 1 | 2 | 350 | 800 | 60 | 1900 | 12 | 58 | 96 |
| Compar. | 23 | 0.6 | 0.4 | 0.8 | 2.8 | 1 | 0 | 2 | 350 | 800 | 60 | 2000 | 68 | 22 | 97 |
| Examples | 24 | 0.5 | 0.5 | 0.8 | 2.2 | 0.5 | 0.5 | 2 | 350 | 800 | 60 | 2110 | 6 | 24 | 94 |
| | 25 | 0.1 | 0.9 | 0.8 | 3.0 | 0 | 1 | 2 | 350 | 800 | 60 | 2200 | 2 | 10 | 93 |
| | 26 | 0.9 | 0.1 | 0.3 | 3.4 | 1 | 0 | 2 | 350 | 800 | 60 | 1980 | 2 | 18 | 95 |
| | 27 | 0.8 | 0.2 | 0.3 | 1.9 | 0.5 | 0.5 | 2 | 350 | 800 | 60 | 1950 | 1 | 12 | 96 |
| | 28 | 0.7 | 0.3 | 0.3 | 2.0 | 0 | 1 | 2 | 350 | 800 | 60 | 2030 | 2 | 10 | 98 |
| | 29 | 0.8 | 0.2 | 0.9 | 1 | 0.5 | 0.5 | 2 | 350 | 800 | 60 | 2150 | 3 | 9 | 97 |
| | 30 | 0.8 | 0.2 | 0.9 | 4 | 0.5 | 0.5 | 2 | 350 | 800 | 60 | 2230 | Unmeasurable due to loss of insulating properties of thin film | | |

TABLE 6

(Sr, Pb)-Bi-(Ta, Nb)-base

| | | Composition ratios of target materials (Sr:Ba):Bi:(Ta:Nb) = (a:c)X:Y:(m:n)Z = aX:cX:Y:mZ:nZ | | | | | | | Film formation temp. | Heat treatment cond. | | Film | Residual polarization | Coercive | Film fatigue |
|---|---|---|---|---|---|---|---|---|---|---|---|---|---|---|---|
| Thin films | | a (Sr) | c (Pb) | X | Y | m (Ta) | n (Nb) | Z | Temp. (°C.) | Temp. (°C.) | Time (min.) | thickness (Å) | ($\mu C/cm^2$) 2P$_r$ | electric field (kV/cm) 2E$_c$ | properties (%) |
| Examples | 28 | 0.9 | 0.1 | 0.8 | 2.4 | 1 | 0 | 2 | 350 | 800 | 60 | 2000 | 16 | 70 | 96 |
| | 29 | 0.8 | 0.2 | 0.8 | 2.2 | 0.5 | 0.5 | 2 | 350 | 800 | 60 | 2100 | 19 | 75 | 96 |
| | 30 | 0.7 | 0.3 | 0.8 | 1.9 | 0 | 1 | 2 | 350 | 800 | 60 | 2030 | 24 | 82 | 92 |
| | 31 | 0.7 | 0.3 | 0.4 | 2.3 | 1 | 0 | 2 | 350 | 800 | 60 | 2140 | 12 | 70 | 93 |
| | 32 | 0.8 | 0.2 | 0.4 | 2.8 | 0.5 | 0.5 | 2 | 350 | 800 | 60 | 2250 | 12 | 69 | 94 |
| | 33 | 0.9 | 0.1 | 0.4 | 2.1 | 0 | 1 | 2 | 350 | 800 | 60 | 1980 | 11 | 72 | 94 |
| Compar. | 31 | 0.6 | 0.4 | 0.9 | 2.2 | 1 | 0 | 2 | 350 | 800 | 60 | 1990 | 24 | 79 | 85 |
| Examples | 32 | 0.5 | 0.5 | 0.9 | 2.0 | 0.5 | 0.5 | 2 | 350 | 800 | 60 | 2070 | 26 | 82 | 80 |
| | 33 | 0.2 | 0.8 | 0.9 | 2.4 | 0 | 1 | 2 | 350 | 800 | 60 | 2240 | 28 | 89 | 20 |
| | 34 | 0.9 | 0.1 | 0.2 | 1.8 | 1 | 0 | 2 | 350 | 800 | 60 | 2350 | 2 | 10 | 96 |

TABLE 6-continued (Sr, Pb)-Bi-(Ta, Nb)-base

| Thin films | Composition ratios of target materials (Sr:Ba):Bi:(Ta:Nb) = (a:c)X:Y:(m:n)Z = aX:cX:Y:mZ:nZ | | | | | | | Film formation temp. | Heat treatment cond. | | Film thickness (Å) | Residual polarization ($\mu C/cm^2$) $2P_r$ | Coercive electric field (kV/cm) $2E_c$ | Film fatigue properties (%) |
|---|---|---|---|---|---|---|---|---|---|---|---|---|---|---|
| | a (Sr) | c (Pb) | X | Y | m (Ta) | n (Nb) | Z | Temp. (°C.) | Temp. (°C.) | Time (min.) | | | | |
| 35 | 0.8 | 0.2 | 0.2 | 2.6 | 0.5 | 0.5 | 2 | 350 | 800 | 60 | 2110 | 1 | 5 | 94 |
| 36 | 0.7 | 0.3 | 0.2 | 2.8 | 0 | 1 | 2 | 350 | 800 | 60 | 1910 | 2 | 8 | 93 |
| 37 | 0.8 | 0.2 | 0.8 | 1.0 | 0.5 | 0.5 | 2 | 350 | 800 | 60 | 2060 | 1 | 4 | 94 |
| 38 | 0.9 | 0.1 | 0.8 | 3.8 | 0.5 | 0.5 | 2 | 350 | 800 | 60 | 2220 | Unmeasurable due to loss of insulating properties of thin film | | |

TABLE 7

(Sr, Ba, Pb)-Bi-(Ta, Nb)-base

| Thin films | | Composition ratios of target materials (Sr:Ba:Pb):Bi:(Ta:Nb) = (a:b:c)X:Y:(m:n)Z = aX:bX:cX:Y:mZ:nZ | | | | | | | | Film formation temp. | Second-firing cond. | | Film thickness (Å) | Residual polarization ($\mu C/m^2$) $2P_r$ | Coercive electric field (k/cm) $2E_c$ | Film fatigue proper-ties (%) |
|---|---|---|---|---|---|---|---|---|---|---|---|---|---|---|---|---|
| | | a (Sr) | b (Ba) | c (Pb) | X | Y | m (Ta) | n (Nb) | Z | Temp. (°C.) | Temp. (°C.) | Time (min.) | | | | |
| Examples | 34 | 0.8 | 0.1 | 0.1 | 0.9 | 2.4 | 0.9 | 0.1 | 2 | 350 | 800 | 60 | 1950 | 19 | 74 | 98 |
| | 35 | 0.7 | 0.1 | 0.2 | 0.9 | 2.6 | 0.1 | 0.9 | 2 | 350 | 800 | 60 | 2100 | 24 | 85 | 94 |
| | 36 | 0.9 | 0.05 | 0.05 | 0.5 | 2.6 | 0.5 | 0.5 | 2 | 350 | 800 | 60 | 2030 | 12 | 51 | 92 |
| | 37 | 0.7 | 0.2 | 0.1 | 0.5 | 2.1 | 1 | 0 | 2 | 350 | 800 | 60 | 2200 | 11 | 48 | 96 |
| Compar. | 39 | 0.5 | 0.2 | 0.3 | 0.9 | 2.8 | 0.2 | 0.8 | 2 | 350 | 800 | 60 | 2160 | 16 | 70 | 87 |
| Examples | 40 | 0.8 | 0.1 | 0.1 | 0.2 | 1.9 | 1.0 | 0 | 2 | 350 | 800 | 60 | 1990 | 2 | 10 | 94 |
| | 41 | 0.8 | 0.1 | 0.1 | 0.9 | 1.0 | 0.5 | 0.5 | 2 | 350 | 800 | 60 | 2060 | 4 | 12 | 92 |
| | 42 | 0.7 | 0.1 | 0.2 | 0.9 | 4.0 | 0.1 | 0.9 | 2 | 350 | 800 | 60 | 2300 | Unmeasurable due to loss of insulating properties of thin film | | |

The examples demonstrate that the method for preparing the Bi-based ferroelectric thin films with the target materials allows for the formation of high-performance Bi-based ferroelectric thin films with increased residual polarization and reduced film fatigue, by sputtering.

Japanese Patent Applications HEI-7-122423, filed May 22, 1995; HEI-7-173438, filed Jul. 10, 1995; and HEI 7-181780, filed Jul. 18, 1995, are all hereby incorporated by reference.

Obviously, additional modifications and variations of the present invention are possible in light of the above teachings. It is therefore to be understood that within the scope of the appended claims, the invention may be practiced otherwise than as specifically described herein.

What is claimed is:

1. A composition comprising a composite oxide containing Sr, Bi and Ta in proportions which satisfy the formula $(Sr_xBi_{1-x})Bi_2Ta_2$ wherein $0.3 \leq X < 0.9$.

2. The composition of claim 1, wherein $0.5 \leq x < 0.9$.

3. The composition of claim 1, wherein said composition is a film.

4. The composition of claim 3, wherein $0.5 \leq x < 0.9$.

5. The composition of claim 3, wherein the film has a thickness of 10 nm to 1 $\mu$m.

6. A composition comprising a composite oxide containing Sr, Bi, Ta according to claim 1 and at least one member selected from the group consisting of Pb, Ba and Nb, and said composition is ferroelectric.

7. The composition of claim 6, wherein said composition is a film.

8. A composition, comprising metal compounds, wherein said composition contains a molar ratio of elements represented by A:B:C=X:Y:Z, wherein:

A represents Sr and one or two members selected from the group consisting of Ba and Pb;

B represents Bi;

C represents one or two members selected from the group consisting of Ta and Nb; and wherein $0.4 \leq X < 0.9$, $1.5 \leq Y \leq 3.5$, and Z=2;

wherein the molar ratio of Sr:Ba:Pb=a:b:c. and $0.7X \leq a < X$, and $0 < b+c \leq 0.3X$, and wherein the molar ratio of Ta:Nb=m:(1−m), and $0 \leq m \leq 0.7$.

9. The composition of claim 8, wherein said composition further comprises an organic solvent, and said composition is a solution.

10. The composition of claim 9, wherein said Sr, Bi and Ta are present in a total amount of 5–15% by weight of said solution, in terms of oxides.

11. The composition of claim 8, wherein said composition is a sintered target, and said metal compounds are oxides.

12. The composition of claim 11, wherein said composition is prepared by hot pressing at a temperature of 800°–1,200° C., and a pressure of 30–400 kg/cm², in an atmosphere under reduced pressure of $1 \times 10^{-1}$ to $1 \times 10^{-5}$ Torr or in a vacuum, for 30 minutes to 4 hours.

* * * * *